US006963598B1

(12) United States Patent
Guenter et al.

(10) Patent No.: US 6,963,598 B1
(45) Date of Patent: Nov. 8, 2005

(54) SYSTEM AND METHOD FOR VCSEL POLARIZATION CONTROL

(75) Inventors: James K. Guenter, Garland, TX (US); Jimmy A. Tatum, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/577,034

(22) Filed: May 23, 2000

(51) Int. Cl.[7] ................................. H01S 3/08
(52) U.S. Cl. ..................................... 372/106
(58) Field of Search ............... 372/45, 109, 27, 372/29, 43, 106; 148/DIG. 45; 385/14

(56) References Cited

U.S. PATENT DOCUMENTS

| | | | |
|---|---|---|---|
| 3,609,008 A | * | 9/1971 | Dillon et al. ............... 359/283 |
| 5,079,774 A | | 1/1992 | Mendez et al. |
| 5,117,469 A | | 5/1992 | Cheung et al. |
| 5,331,654 A | * | 7/1994 | Jewell et al. .................. 372/45 |
| 5,390,209 A | * | 2/1995 | Vakhshoori .................. 372/27 |
| 5,396,508 A | | 3/1995 | Bour et al. |
| 5,412,678 A | | 5/1995 | Treat et al. |
| 5,412,680 A | | 5/1995 | Swirhun et al. |
| 5,418,806 A | * | 5/1995 | Araki .......................... 372/29 |
| 5,438,584 A | | 8/1995 | Paoli et al. |
| 5,465,263 A | | 11/1995 | Bour et al. |
| 5,497,390 A | * | 3/1996 | Tanaka et al. ................ 372/27 |
| 5,586,131 A | | 12/1996 | Ono et al. |
| 5,590,145 A | | 12/1996 | Nitta |
| 5,629,919 A | * | 5/1997 | Hayashi et al. ............. 369/112 |
| 5,645,462 A | | 7/1997 | Banno et al. |
| 5,648,978 A | | 7/1997 | Sakata |
| 5,699,373 A | | 12/1997 | Uchida et al. |
| 5,712,188 A | * | 1/1998 | Chu et al. ............. 148/DIG. 95 |
| 5,727,014 A | | 3/1998 | Wang et al. |
| 5,761,229 A | * | 6/1998 | Baldwin et al. ............ 372/109 |
| 5,784,399 A | | 7/1998 | Sun |
| 5,828,684 A | | 10/1998 | Van de Walle |
| 5,901,166 A | | 5/1999 | Nitta et al. |
| 5,953,362 A | | 9/1999 | Pamulapati et al. |
| 5,986,998 A | * | 11/1999 | Park ........................... 369/121 |
| 5,995,531 A | * | 11/1999 | Gaw et al. ................... 372/106 |
| 6,002,705 A | | 12/1999 | Thornton |
| 6,008,675 A | | 12/1999 | Handa |
| 6,031,856 A | * | 2/2000 | Wu et al. ...................... 372/43 |
| 6,043,104 A | | 3/2000 | Uchida et al. |

(Continued)

FOREIGN PATENT DOCUMENTS

EP    0 455 939 A2    11/1991

(Continued)

OTHER PUBLICATIONS

PCT International Search Report on related PCT Application PCT/US 01/16390; mailed Apr. 11, 2002.

(Continued)

Primary Examiner—Tuyet Vo
Assistant Examiner—Hung Tran Vy
(74) Attorney, Agent, or Firm—Workman Nydegger

(57) ABSTRACT

A system and method for VCSEL (vertical cavity surface emitting laser) polarization control is disclosed, including methods and apparatus comprising a component package (302, 304) having self-aligning features (316, 318), for indicating an alignment axis (320, 322), and an upper surface aperture (314) formed therein, a vertical cavity surface emitting laser device (308) having two emission polarizations (204) normal to one another, disposed within the component package and aligned such that each emission polarization is at about 45 degrees with respect to the alignment axis, and a linear polarization element (400, 402, 406) having a polarization direction (206), spanning the aperture and disposed such that the polarization direction is parallel to the alignment axis.

22 Claims, 5 Drawing Sheets

U.S. PATENT DOCUMENTS

| | | | |
|---|---|---|---|
| 6,069,905 A * | 5/2000 | Davis et al. | 372/43 |
| 6,302,596 B1 * | 10/2001 | Cohen et al. | 385/93 |
| 6,370,290 B1 * | 4/2002 | Ball et al. | 385/14 |
| 6,380,533 B1 * | 4/2002 | Jopson et al. | 250/225 |
| 6,434,105 B1 * | 8/2002 | Kobayashi | 369/112.28 |
| 6,567,435 B1 * | 5/2003 | Scott et al. | 372/29.021 |
| 2003/0071995 A1 * | 4/2003 | Kurata et al. | 356/364 |

FOREIGN PATENT DOCUMENTS

| | | |
|---|---|---|
| EP | 0 455 939 A3 | 11/1991 |
| JP | 01 244687 | 9/1989 |
| JP | 05 241048 | 9/1993 |
| JP | 08 056049 | 2/1996 |

OTHER PUBLICATIONS

Jung-Hoon Ser, et al.; "Polarization stabilization of vertical-cavity top-surface-emitting lasers by inscription of fine metal-interlaced gratings"; magazine article from Applied Physics Letters; American Institute of Physics; New York, U.S.A.

P.r. claisse, et al.; "Automatic Power Control of a VCSEL Using an Angled Lid T056 Package"; published presentation from Electronic Components & Technology Conference; 1998; 48th IEEE Seattle, WA, no month.

* cited by examiner

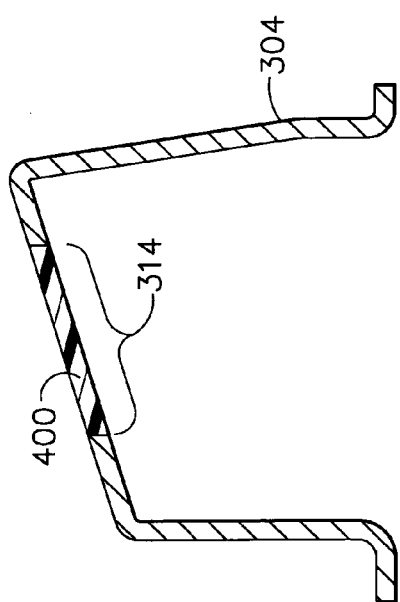
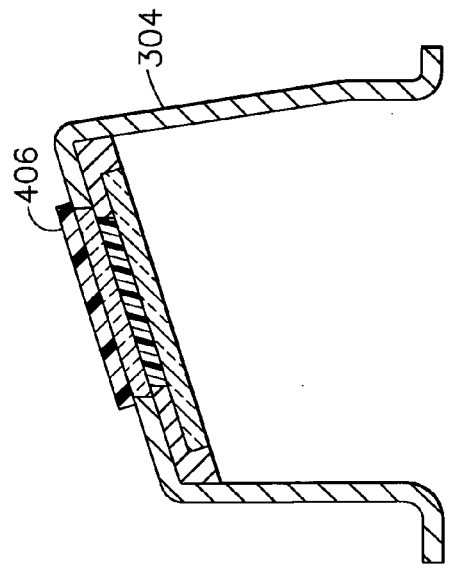
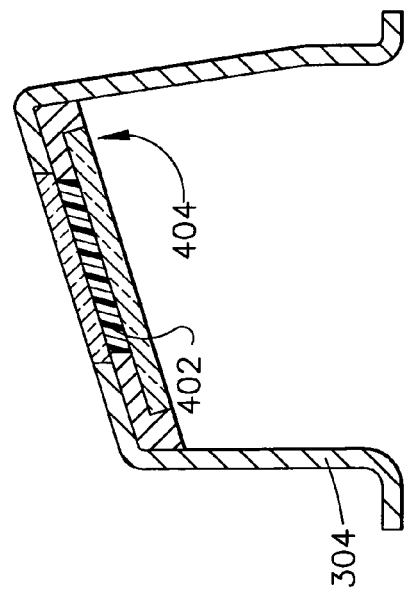
FIG. 4a
FIG. 4b
FIG. 4c

SYSTEM AND METHOD FOR VCSEL POLARIZATION CONTROL

BACKGROUND OF THE INVENTION

The present invention relates, in general, to vertical cavity surface emitting lasers (VCSELs) and, in particular, to a system for versatile control of VCSEL polarization.

The Vertical Cavity Surface Emitting Laser (VCSEL) is rapidly becoming a workhorse technology for semiconductor optoelectronics. VCSELs can typically be used as light emission sources anywhere other laser sources (e.g., edge emitting lasers) are used and provide a number of advantages to system designers. Hence, VCSELs are emerging as the light source of choice for modern high speed, short wavelength communication systems and other high volume applications such as optical encoders, reflective/transmissive sensors and optical read/write applications. Inherently low cost of manufacture, enhanced reliability, non-astigmatic and circularly symmetric optical output are just some of the advantages of VCSELs over traditional laser sources.

However, VCSELs emit light that is polarized along their crystallographic cleavage planes. Unconstrained polarization switching is an inherent characteristic of the crystalline structure and growth process of VCSELs. As typically constructed, VCSELs can readily switch polarization states and frequently emit light simultaneously from multiple polarization states. This phenomenon presents some problems and challenges for system designers using VCSELs in their applications. Controlling polarization of the optical signal is important for many sensor applications.

Inconsistent power output and switching noise are common examples of types of problems resulting from uncontrolled VCSEL polarization. Consider, for example, an optoelectronic system that utilizes polarization selective components concentrating on only one of a VCSEL's two polarizations. If the VCSEL is emitting exclusively from that one polarization, then the system receives 100% of the VCSEL power. If, however, the VCSEL is emitting exclusively from the other polarization, then the system receives none of the VCSEL power. If the VCSEL is switching between, or emitting simultaneously from, the two polarizations, then the system will receive intermittent, or partial, power respectively. Also consider, for example, a data communications system that performs high-speed switching. Oscillation between the VCSEL polarizations results in switching noise that can impact system performance and reliability. In systems where the power and noise effects of VCSEL polarization combine, extensive noise and related system problems result.

Previously, some applications incorporated no direct solution to polarization problems; either suffering the consequences or adding a significant amount of additional circuitry and/or components to compensate for the effects. Some conventional methods have attempted to control VCSEL polarization at the chip level. These efforts have typically focused on modifying the VCSEL growth process and/or post-growth chip level processing to provide some level of polarization control. Some such approaches have introduced asymmetry to increase the degree of preference for one polarization over another. While these efforts may have, in some cases, provided partial relief from polarization problems, they often led to other problems of their own such, as increased noise and increased beam divergence. These approaches have further added to the production costs of the VCSEL components and often change the electrical characteristics of the component; yielding different reliability and new characterization data for each variation and resulting in VCSELs highly specialized for one particular application, reducing economies of scale in high volume VCSEL production.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

As demonstrated above, versatile methods and apparatus for controlling polarization of VCSELs in a cost-effective and readily adaptable manner while minimizing power variance and noise effects are needed; providing polarization insensitive VCSEL sources while overcoming the aforementioned limitations of conventional methods.

In the present invention, an independent polarizing medium is provided in proximity to an unmodified VCSEL and positioned in relation to the VCSEL such that the medium provides equal selection and attenuation of the VCSEL polarization states, maintaining approximately constant power output and providing light emission in a linear, pre-determinable, polarization direction.

In one embodiment of the present invention, a polarization controlled optical energy source comprises a laser source element having an inherent polarization characteristic; and a polarization medium positioned in proximal relation to the laser source element and adapted to select and attenuate the polarization characteristic equally.

In another embodiment of the present invention, a vertical cavity surface emitting laser component includes a package base, having a first self-aligning feature formed therein for indicating an alignment axis; a vertical cavity surface emitting laser device, having two emission polarizations normal to one another, disposed upon the package base and aligned such that each emission polarization is at about 45 degrees with respect to the alignment axis; a package cover, having a second self-aligning feature and an upper surface aperture formed therein, coupled to the package base such that the first and second self-aligning features matably engage; and a linear polarization element, having a polarization direction, spanning the aperture and disposed such that the polarization direction is parallel to the alignment axis.

In yet another embodiment of the present invention, a method for VCSEL polarization control comprises the steps of providing a VCSEL element having an inherent polarization characteristic; providing a polarization medium; and positioning the polarization medium in proximal relation to the laser source element to select and attenuate the polarization characteristic equally.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

FIG. 4(a) is an illustrative diagram of one embodiment of a portion of the component of FIG. 3(a) in accordance with the present invention;

FIG. 4(b) is an illustrative diagram of one embodiment of a portion of the component of FIG. 3(a) in accordance with the present invention; and FIG. 4(c) is an illustrative diagram of one embodiment of a portion of the component of FIG. 3(a) in accordance with the present invention.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of exemplary ways to make and use the invention and do not delimit the scope of the invention.

It should be understood that the principles and applications disclosed herein can be applied in a wide range of optoelectronic applications. For purposes of explanation and illustration, the present invention is hereafter described in reference to VCSEL light sources. However, the same system can be applied in other applications where multiple polarization light sources are utilized.

VCSELs emit light that is polarized along their crystallographic cleavage planes. Since VCSEL laser emission is perpendicular to the quantum wells of the VCSEL, there is no polarization selection from the optical transition matrix. Characteristically, VCSELS can switch polarization states, and, in fact, both polarization states often exist. This is illustrated in FIG. 1.

Figure 1:
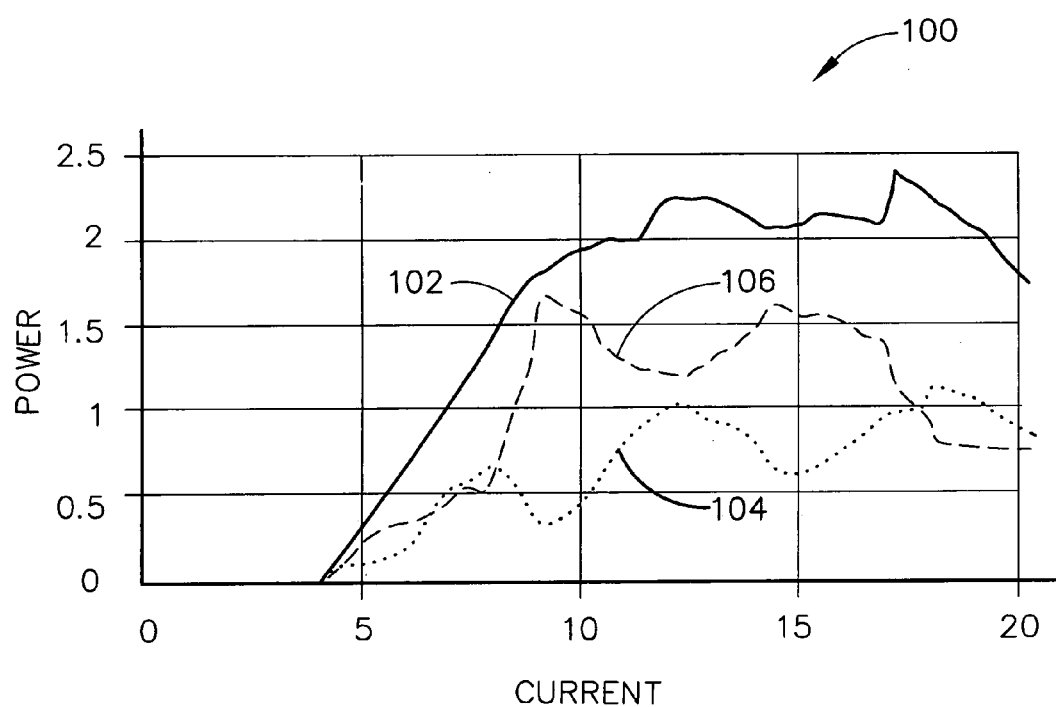
FIG. 1 is a representative plot of VCSEL power in relation to current.

Referring now to FIG. 1, plot 100 depicts the power emission as a function of current for a particular VCSEL. In plot 100, line 102 represents the total power emitted as a function of current from the VCSEL. VCSEL light output versus current was measured with a polarizer oriented along the (011) plane, represented by line 104, the (011') plane, represented by line 106, and with the polarizer oriented at a plane parallel to the (001) or (010) crystal planes, represented by line 102. This particular VCSEL was grown on (100) oriented wafers, thus the VCSEL light is always polarized parallel to the cleavage planes, (011) and (011'), which are normal with respect to one another, and the total power from the VCSEL is constant, independent of the relative polarization intensities. This is illustrated by the fact that line 102 equals the sum of lines 104 and 106. Line 102 is scaled by a factor of two in order to show the total power emitted from the VCSEL. It should be noted from plot 100 that the amount of light polarized along either of the planes individually, as represented by lines 104 and 106, can change dramatically during operation; while the total power, as represented by line 102 (the sum of lines 104 and 106), is monotonically increasing.

Comprehending this, the present invention recognizes that a linear polarizer positioned to provide equal selection and attenuation of each polarization present will result in balanced and constant VCSEL operation. In the example from FIG. 1, a polarizer placed at about 45 degrees relative to the normal crystal cleavage planes will equally sample the power in either polarization and lead to uncompromised operating characteristics. In particular, this VCSEL plus polarizer is now a stable source of light polarized in a known direction.

Figures 2A, 2B:
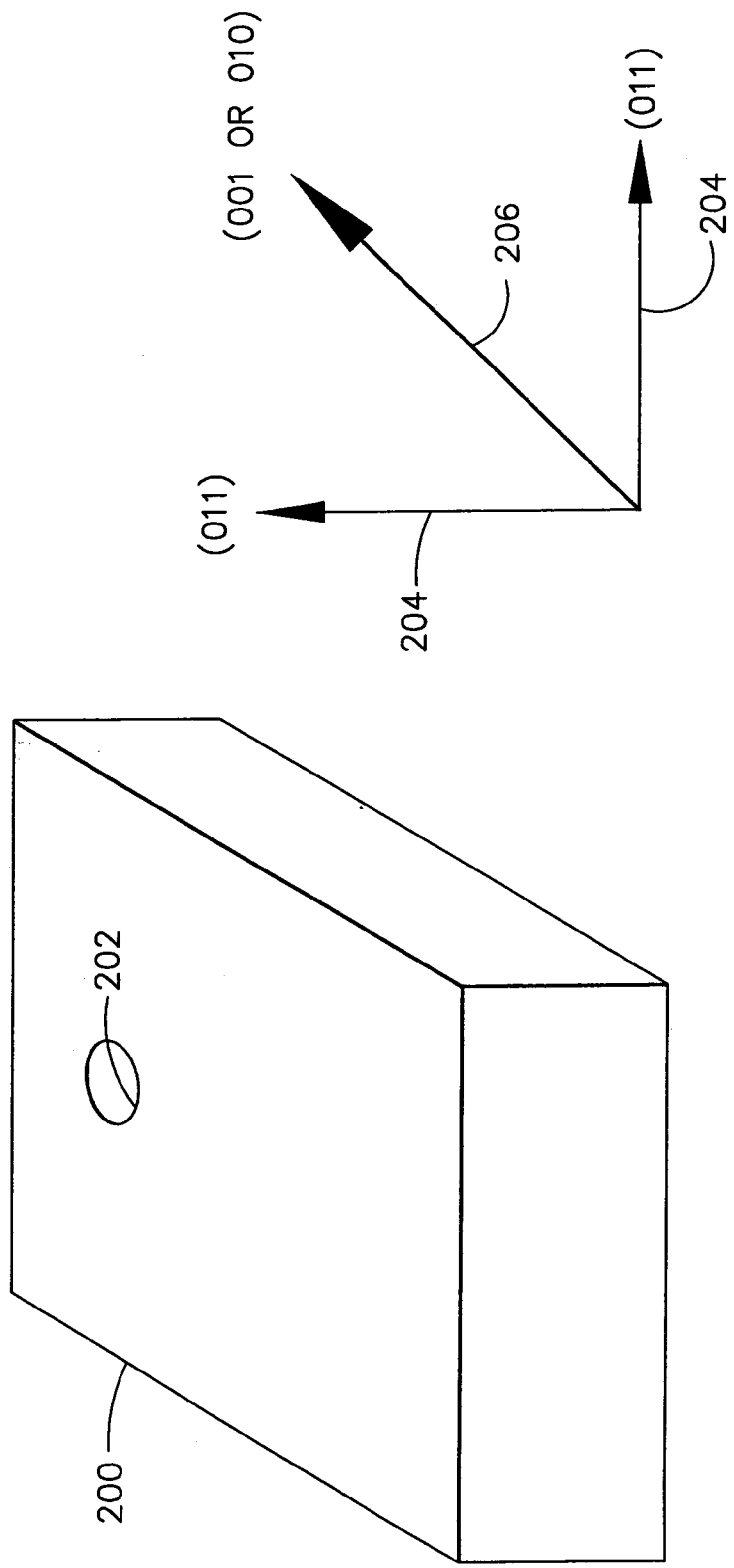
FIG. 2(a) is an illustrative schematic of VCS EL component.
FIG. 2(b) is a representative diagram of VCSEL polarizations.

This is further illustrated in reference now to FIG. 2. FIG. 2(a) depicts a VCSEL component 200 having laser emission aperture 202. Aperture 202 is depicted as substantially circular-shaped, but as should be appreciated by those skilled in the art, it can be formed in a variety of shapes depending on desired behavior and performance. VCSEL 200 is produced with a (100) orientation, and is typically sawed from a wafer such that the cleavage planes are about 2–5 degrees within, and essentially parallel to, the crystalline planes (011) and (011'). Thus, emission of VCSEL 200 will be polarized along the crystalline plane directions 204 (parallel to the cleavage planes), (011) and (011'), as depicted in FIG. 2(b). Proper orientation 206 of a linear polarizer will equally select and attenuate each polarization. For this example, orientation 206 should be at about 45 degrees to both directions 204, which is parallel to the (001) or (010) crystal planes.

The present invention provides a cost-effective, versatile, and easily manufacturable system for providing equal selection and attenuation of a VCSEL's emission polarizations. The system of the present invention provides orientation of the optical polarizer such that stable polarization is achieved without introduction of additional optical noise or other artifacts. The present invention provides for creation of a polarization controlled light source from a standard, multi-purpose VCSEL without chip-level processing or VCSEL customization.

Figure 3A:
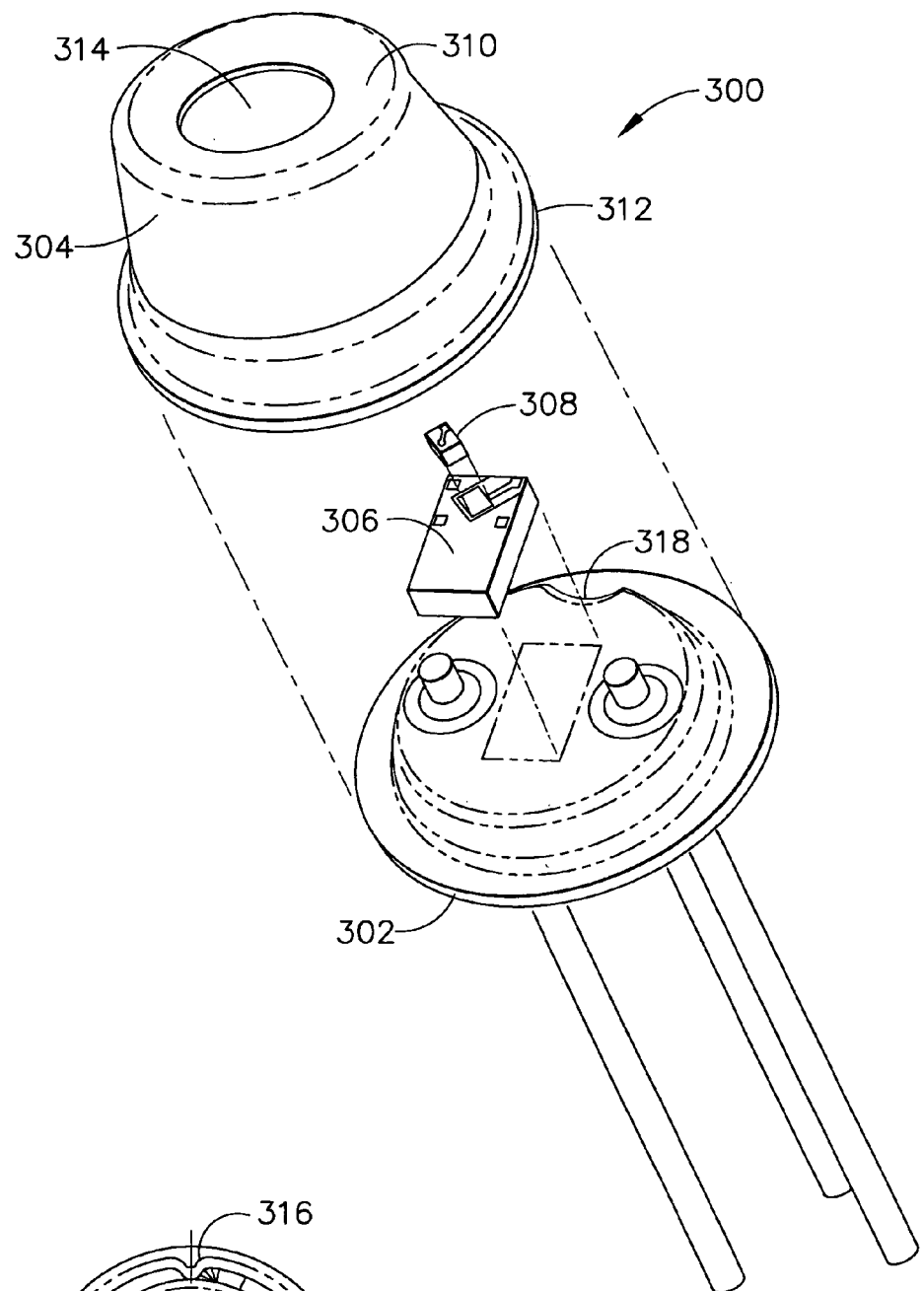
FIG. 3(a) is an illustrative embodiment of a VCSEL component according to the present invention.

The present invention is now illustrated in reference to an exemplary embodiment as depicted in FIG. 3(a). An exploded view of an optical sensor component 300 according to the present invention is shown. Component 300 comprises a package base 302, a cover 304, a sensing element 306 (typically a photo-diode), and a VCSEL component 308. The upper surface 310 of cover 304 is sloped with respect to the base 312 of cover 304, to provide return light and a naturally selective asymmetry for this particular application. Alternatively, upper surface 310 can be substantially parallel to base 312. Cover 304 also has a window 314 formed therein to allow for optical energy transmission through cover 304. As component 300 is assembled, sensing element 306 is disposed upon base 302, VCSEL element 308 is disposed upon sensing element 306, and cover 304 is matably coupled to base 302, enclosing elements 306 and 308. The configuration and positioning of each of these elements provides for ease of alignment of a polarization component according to the present invention.

Figure 3B:
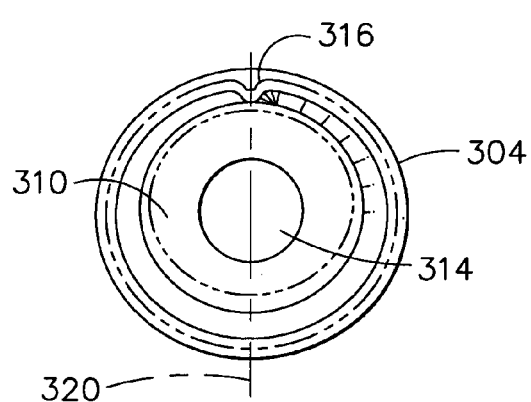
FIG. 3(b) is an illustrative diagram of a portion of the component of FIG. 3(a)

Referring now to FIG. 3(b), cover 304 further comprises an alignment indicator 316 that matably engages with an alignment indicator 318 formed in base 302, such that the secure coupling of cover 304 to base 302 is self-aligning and constricted to a distinct alignment. Indicators 316 and 318 are shown as notch-type indicators although, alternatively, indicators 316 and 318 can comprise a number of manual or self-aligning configurations such as bumps, slot/tabs, simple visual markings, and others. Indicator 316 is provided to indicate an axis of alignment 320 for reference. In the particular embodiment shown, axis 320 coincides with the axis of slope of surface 310. As depicted, surface 310 slopes upward from the side closest to indicator 316 to the side farthest from indicator 316.

Figure 3C:
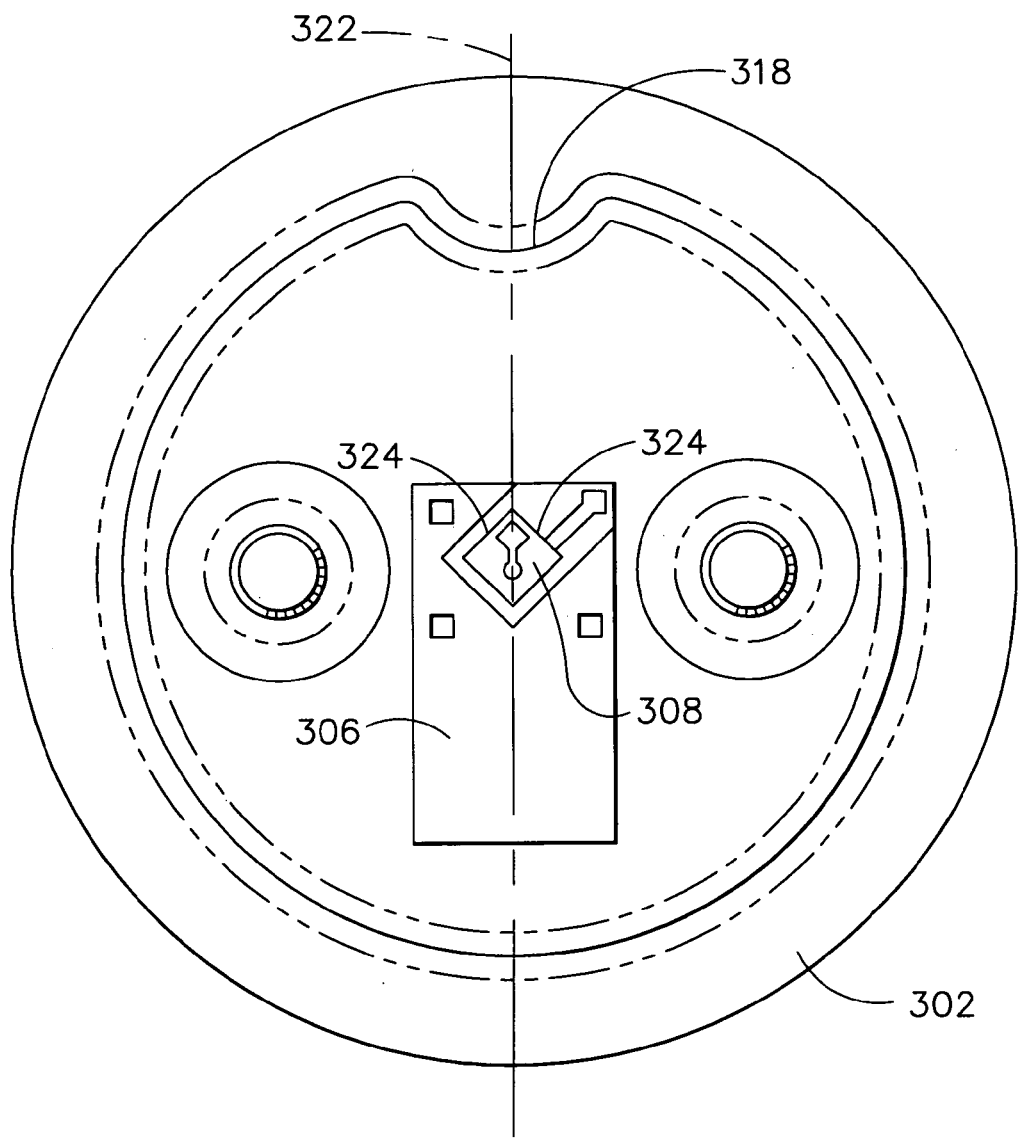
FIG. 3(c) is an illustrative diagram of a portion of the component of FIG. 3(a)

Component alignment is further detailed in reference now to FIG. 3(c). Indicator 318 is formed within base 302 to indicate an axis of alignment 322 for reference. It should be apparent that axes 320 and 322 are parallel and, in this embodiment, coincide. VCSEL 308 is disposed such that its edges 324, which coincide with its crystalline plane directions, are both at about 45 degrees with respect to axis 322. Thus, a polarization element aligned along (or parallel to) axis 322 will provide equal selection and attenuation of the emission polarizations of VCSEL 308 in accordance with the present invention.

Referring now to FIG. 4, several alternatives for providing a polarization member in accordance with the present invention are illustrated in reference to cross sectional view of cover 304. FIG. 4(a) depicts a polarization element 400 disposed within window 314 of cover 304. Element 400 comprises a plate or sheet polarizer, made of glass, plastic, or other suitable medium. Element 400 is formed into the shape of, and disposed within, window 314 such that its polarization direction aligns with axis 320. Element 400 can be secured or formed within cover 304, by encapsulation, adhesive, or crimping, for example. As illustrated in FIG. 4(b), a polarization element 402 can alternatively be incorporated within cover 304 disposed within other optical elements 404 (e.g. lenses, filters). FIG. 4(c) depicts another alternative wherein polarization element 406 is disposed on top of surface 310 covering window 314. Element 406 can be affixed to cover 304 by an adhesive, epoxy, or other suitable application medium.

Typically, the polarization medium will be selected based on the wavelength of the laser source used. Polarization elements can be formed by a number of methods, depending on particular design constraints and desired performance characteristics. Examples include die-cutting a desired polarization material, using a polymer-based polarizer disposed upon some other optical element, and using an etched diffraction element or a formed film-type holographic element. All such media can be used to form a linear polarization element in accordance with the teachings of the present invention.

Alternatively, a polarization element can be internal, but unattached, to cover 304, disposed between VCSEL 308 and window 314. For example, a polarization element can comprise a self-adhesive sheet that can be readily be disposed upon and removed from the upper surface of VCSEL 308, much like a decal. A polarization element can also comprise a pane-like structure positioned above the upper surface of VCSEL 308 and supportively affixed to either sensing element 306 or base 302. In other embodiments, a polarization element according to the present invention can be associated with VCSEL 308 entirely external to and independent from component 300, merely placed in the optical emission path thereof to ensure linear polarization in accordance with the teachings of the present invention.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. The teachings and concepts of the present invention can be applied to other types of components, packages and structures, such as VCSEL components produced with other than a (100) orientation. The invention is applicable independent of a particular package configuration. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A polarization controlled optical energy source comprising:
   a laser source element that produces a light output that has at least two polarization states; and
   a polarization medium positioned in proximal relation to the laser source element for polarizing the light output in a third polarization state that selects and attenuates each of the at least two polarization states equally or substantially equally.

2. The source of claim 1, wherein said laser source element is disposed within a component package having an emission aperture formed therein.

3. The source of claim 2, wherein said polarization medium provides linear polarization.

4. The source of claim 3, wherein said laser source element has multiple distinct polarization states oriented with respect to one another at angular intervals.

5. The source of claim 4, wherein said polarization medium is aligned to provide linear polarization along an axis that equally selects and attenuates the distinct polarization states.

6. The source of claim 1, wherein said laser source element is a vertical cavity surface emitting laser.

7. The source of claim 6, wherein said vertical cavity surface emitting laser is disposed within a component package having an emission aperture formed therein.

8. The source of claim 7, wherein said polarization medium provides linear polarization.

9. The source of claim 8, wherein said laser source element has two distinct polarization states that are normal to one another.

10. The source of claim 9, wherein said polarization medium is aligned to provide linear polarization along an axis that is at about 45 degrees to both distinct polarization states.

11. The source of claim 10, wherein said polarization medium is affixed to the component package spanning the emission aperture.

12. The source of claim 10, wherein said polarization medium is disposed within the component package between the vertical cavity surface emitting laser and the emission aperture.

13. The source of claim 10, wherein said polarization medium is formed from a sheet polarization material.

14. The source of claim 10, wherein said polarization medium is formed by the application of polymer-based polarization material.

15. A method for VCSEL polarization control comprising the steps of:
- providing a VCSEL element that produces a light output that has one and/or both of at least two polarization states;
- providing a polarization medium that polarizes the light output in a third polarization state; and
- positioning the polarization medium in proximal relation to the VCSEL element so that the third polarization state selects and attenuates each of the at least two polarization states equally or substantially equally.

16. The method of claim 15, wherein the step of providing a polarization medium further comprises providing a polarization medium that provides linear polarization.

17. The method of claim 16, wherein the step of providing a VCSEL element further comprises providing a VCSEL element having two distinct polarization states that are normal to one another.

18. The method of claim 17, wherein the polarization medium is aligned to provide linear polarization along an axis that is at about 45 degrees to both distinct polarization states.

19. The method of claim 15 further comprising the steps of:
- providing a component package having an emission aperture formed in a surface thereof;
- disposing the VCSEL element within the component package; and
- affixing the polarization medium to the component package spanning the emission aperture.

20. A vertical cavity surface emitting laser component comprising:
- a package base, having a first self-aligning feature formed therein for indicating an alignment axis, the alignment axis not necessarily being in-line with the self-aligning feature;
- a vertical cavity surface emitting laser device, having at least two emission polarization states normal to one another, disposed adjacent the package base and aligned such that each emission polarization state is at about 45 degrees with respect to the alignment axis;
- a package cover, having a second self-aligning feature and an upper surface aperture formed therein, coupled to the package base such that the first and second self-aligning features matably engage; and
- a linear polarization element, having a polarization direction, spanning the aperture and disposed such that the polarization direction is parallel or substantially parallel to the alignment axis.

21. A polarization controlled optical energy source comprising:
- a laser source element for producing a light output that has one and/or both of at least two polarization states; and
- polarization means for polarizing the light output in a third polarization state that selects and attenuates each of the at least two polarization states equally or substantially equally.

22. A method for providing a relatively constant light intensity output from a light source that produces a light beam that has at least two polarization states, the method comprising the steps of:
- providing a polarization medium that polarizes the light beam in a third polarization state; and
- positioning the polarization medium in line with the light beam of the light source so that the third polarization state of the polarization medium selects and attenuates each of the at least two polarization states equally or substantially equally.

* * * * *